United States Patent
Maekawa

(10) Patent No.: US 6,281,435 B1
(45) Date of Patent: Aug. 28, 2001

(54) CHIP-TYPE ELECTRONIC DEVICES

(75) Inventor: Mamoru Maekawa, Kyoto (JP)

(73) Assignee: Rohm Co., Ltd. (JP)

(*) Notice: Subject to any disclaimer, the term of this patent is extended or adjusted under 35 U.S.C. 154(b) by 0 days.

(21) Appl. No.: 09/515,144

(22) Filed: Feb. 29, 2000

(30) Foreign Application Priority Data

Mar. 3, 1999 (JP) .................................. 11-054869

(51) Int. Cl.[7] .............................. H01L 23/28; H05K 5/06
(52) U.S. Cl. .................. 174/52.2; 257/693; 257/730; 257/788; 257/696; 313/512
(58) Field of Search .................. 174/52.2, 52.4; 257/693, 730, 788, 787, 696; 313/512

(56) References Cited

U.S. PATENT DOCUMENTS

Re. 36,614 * 3/2000 Lumbard et al. .................... 313/500
3,735,214 * 5/1973 Renskers et al. .................... 257/696
5,729,437 * 3/1998 Hashimoto ........................... 361/760

* cited by examiner

*Primary Examiner*—Dean A. Reichard
*Assistant Examiner*—Hune V Ngo
(74) *Attorney, Agent, or Firm*—Coudert Brothers

(57) ABSTRACT

A chip-type electronic device has a substrate with a vertically extending groove formed on each of its mutually opposite edges. A solder material fills these grooves partially to a height which is below the top surface of the substrate. Electrode patterns are formed on these edges of the substrate including the inner surfaces of these grooves. A semiconductor electronic element is attached onto the top surface of the substrate. A resin mold seals the entire top surface of the substrate inclusive of the semiconductor element, extending to positions of the edges of the substrate and protruding partially into the grooves so as to serve as hooks to securely attach to the substrate.

5 Claims, 3 Drawing Sheets

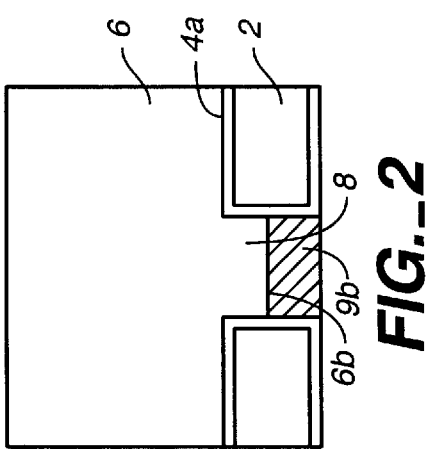
FIG._2
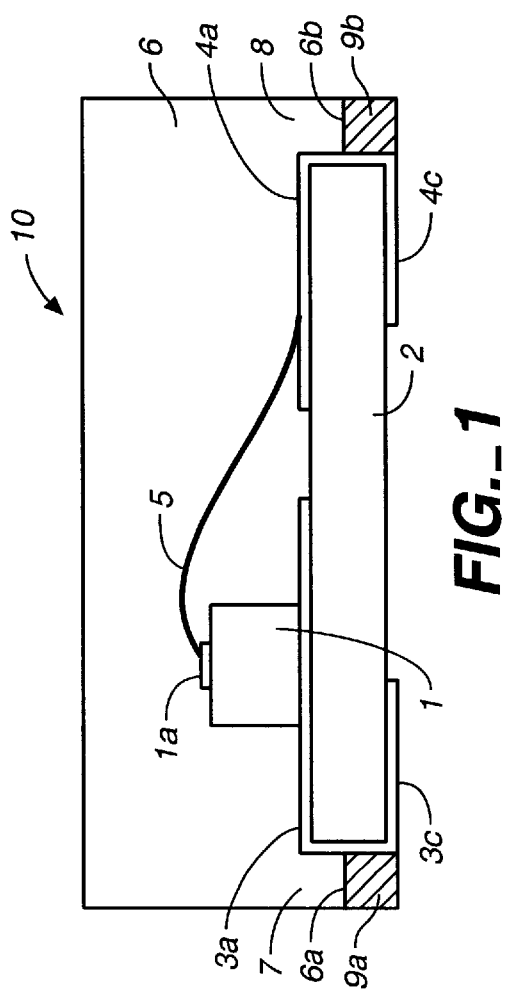
FIG._1
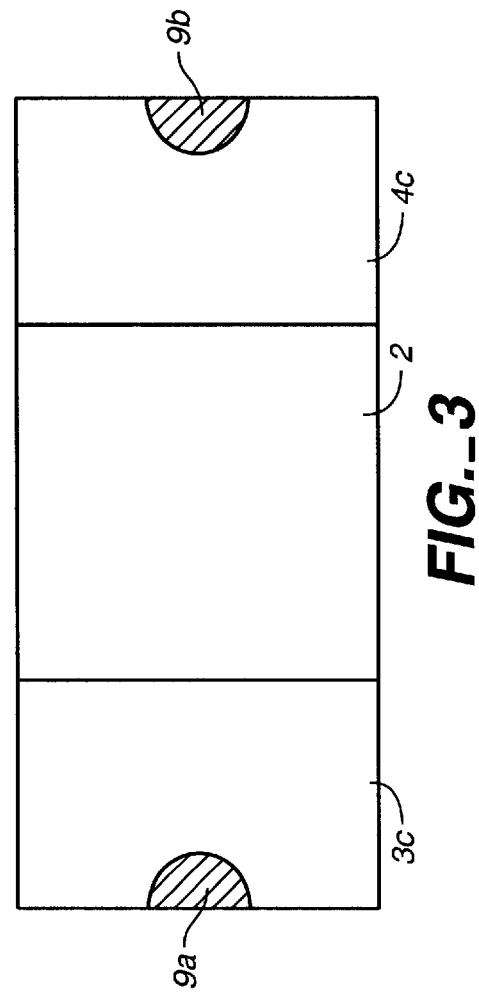
FIG._3

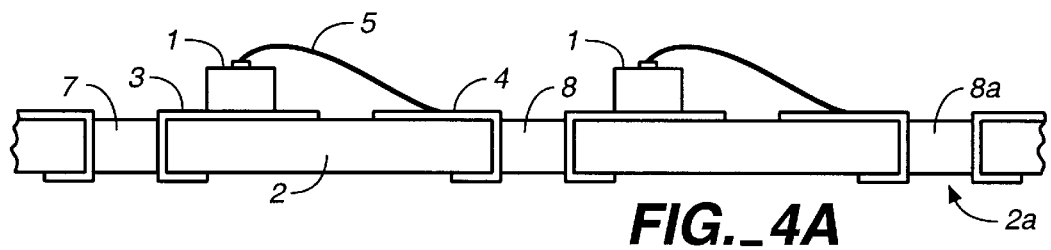
FIG._4A
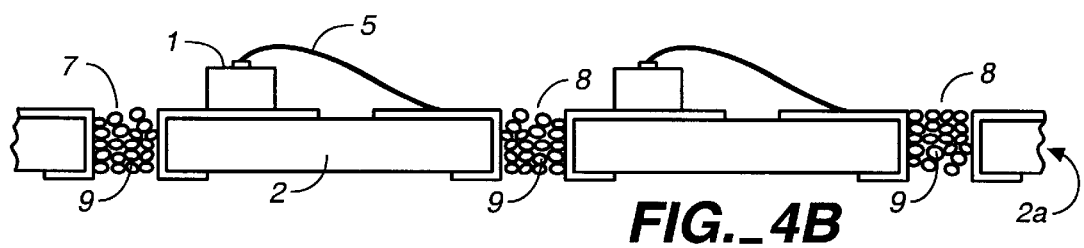
FIG._4B
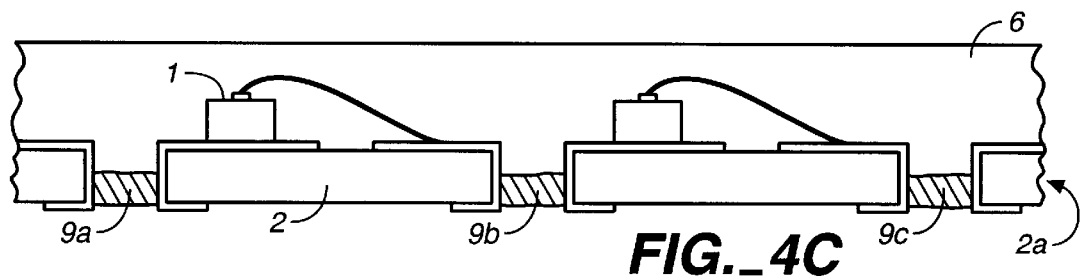
FIG._4C
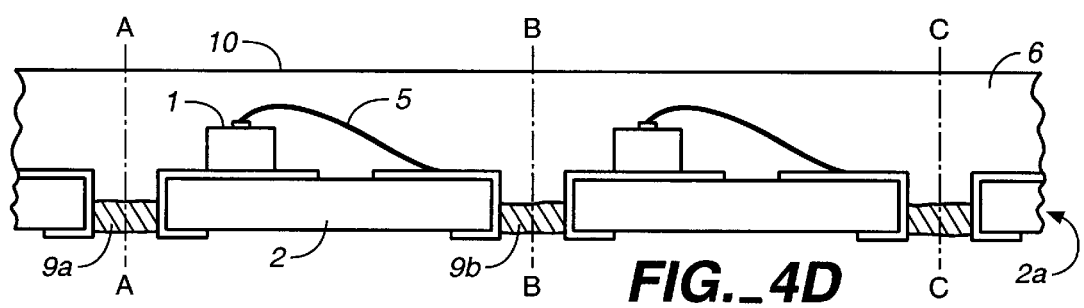
FIG._4D

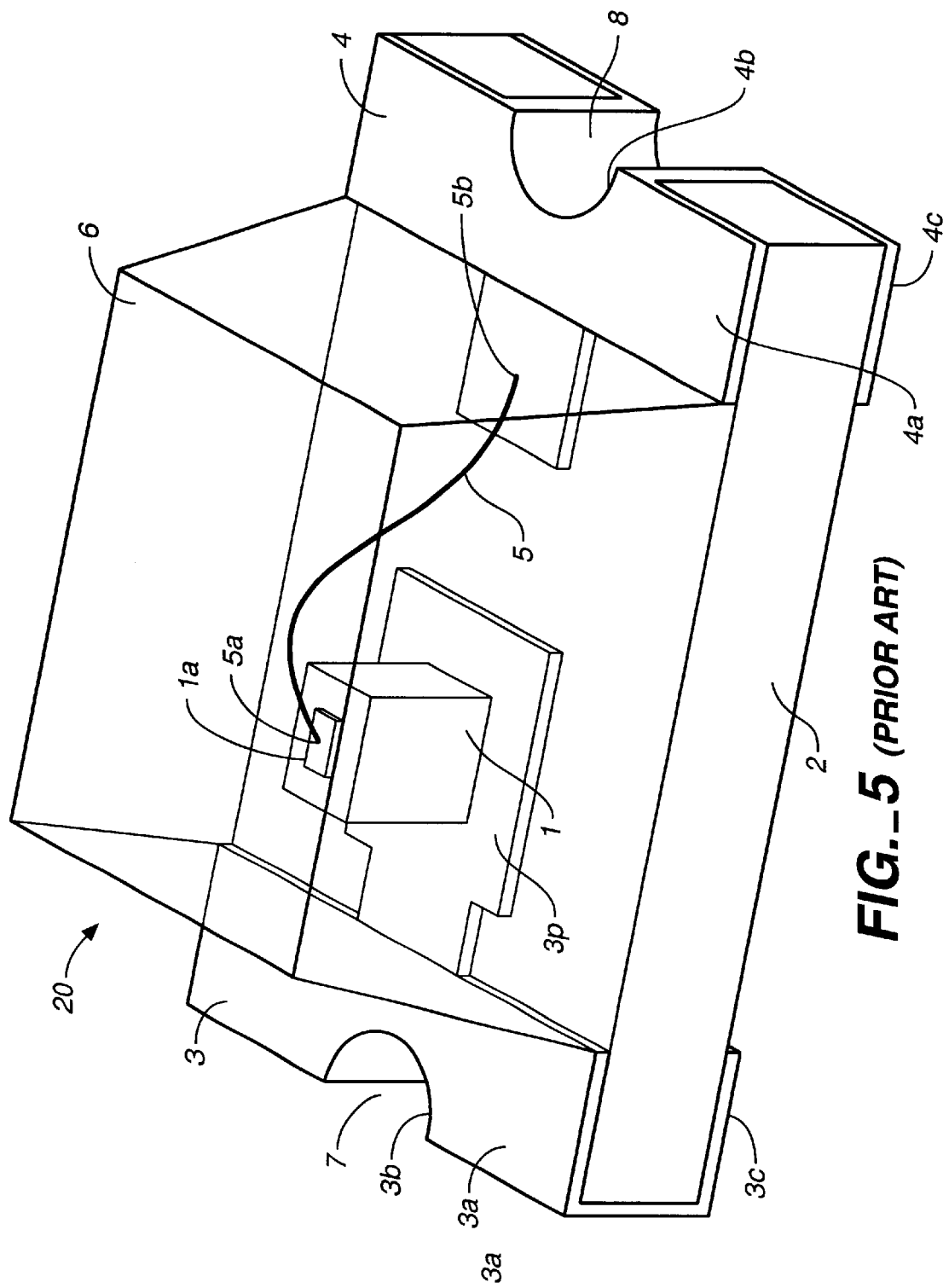
FIG._5 (PRIOR ART)

CHIP-TYPE ELECTRONIC DEVICES

BACKGROUND OF THE INVENTION

This invention relates to chip-type electronic devices having a semiconductor element such as a diode or a transistor mounted to a substrate.

Small-size chip-type light-emitting devices making use of a light-emitting diode (LED) chip have been in use as a light source. FIG. 5 shows a prior art example of this kind of chip-type light-emitting device 20 with a substrate 2 on which is formed a pair of electrode patterns 3 and 4 made of an electrically conductive material, one of these electrode patterns (3) being composed of portions which may be referred to individually as a top surface electrode 3a, a side surface electrode 3b and a bottom surface electrode 3c and electrode 4a, a side surface electrode 4b and a bottom surface electrode 4c. Both end edges of the substrate 3 are provided with a sectionally semi-circular groove (or a throughhole) 7 or 8, and the side surface electrodes 3b and 4b of the pair of electrode patterns 3 and 4 include an electrically conductive film such as a solder flayer formed on the inner surfaces of these grooves 7 and 8. The bottom surface electrodes 3c and 4c are both electrically connected to a wiring pattern on a printed circuit board (not shown). A pad 3p is provided to the upper surface electrode 3a of one of the electrode patterns (3), carrying thereon an LED diode 1 attached thereto by die bonding. The LED 1 has an electrode 1a which is electrically connected to one end 5a of a metallic wire 5 by wire bonding. The other end 5b of the metallic wire 5 is electrically connected to the top surface electrode 4a of the other of the pair of electrode patterns (4). The LED chip 1 and the metallic wire 5 thus connected to the electrode 1a of the LED chip 1 and the top surface electrode 4a are both completely sealed inside a transparent resin mold 6 which is formed so as to cover only a limited surface area on the substrate 3 retracted from the positions of its end edges such that the material for the mold 6 will not flow through the grooves 7 and 8 to the bottom side.

When the device 20 thus formed is mounted to a printed circuit board, it is transported by using a chuck to lift it by having the part of the mold 6 adsorbed thereby. Since the part of the mold 6 is intentionally made smaller than the entire surface of the substrate 2, as explained above, this means that the area by which the chuck can adsorb the device 20 is very small. In the case of a miniaturized device with the length-width dimension less than 1.6×0.8 mm, for example, there was a problem in that the mounting to a circuit board could not be carried out smoothly.

There has been another problem with this prior art device 20 because the mold 6 makes a surface-to-surface contact with the top surface of the substrate 2, as well as with the top surface electrodes 3a and 4a of the pair of electrode patterns 3 and 4. Because of this structure, an external force such as a vibrational force or an impulsive force which may be experienced tends to cause the bottom surface of the mold 6 to become separated from the surface of the substrate 2 and the electrode patterns 3 and 4, thereby adversely affecting the sealed condition of the LED chip 1 and the metallic wire 5.

SUMMARY OF THE INVENTION

It is therefore an object of this invention in view of these problems associated with prior art devices to provide improved chip-type electronic devices which can be mounted more efficiently and with which the shifting of the mold due to an external force can be prevented.

A chip-type electronic device embodying this invention, with which the above and other objects can be accomplished, may be characterized as comprising a substrate having a vertically extending groove formed on each of its mutually opposite edges, a solder material filling these grooves partially to a height which is below the top surface of the substrate, electrode patterns formed on these edges of the substrate, a semiconductor element on the top surface of the substrate, and a resin mold sealing the semiconductor element therein, extending to positions of the edges of the substrate and protruding partially into these grooves. With a device thus characterized, the resin mold, although horizontally extended to the positions of the edges of the substrate, is prevented by the solder material partially filling the grooves from flowing through the grooves to the bottom surface of the substrate, and the side surface electrodes are not covered entirely by the resin mold. Since the resin mold extends to the positions of the both edges of the substrate, its surface area is increased from that of the prior art device shown in FIG. 5, which makes the mounting of the device easier by means of a chuck. Since portions of the resin mold which protrude into the grooves and serve as hooks to more securely fasten the mold to the substrate, the mold, even if subjected to an external force, is not likely to become separated from the substrate.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a front view of a chip-type light-emitting device embodying this invention;

FIG. 2 is a right-hand side view of the chip-type light-emitting device of FIG. 1;

FIG. 3 is a bottom view of the chip-type light-emitting device of FIG. 1;

FIGS. 4A, 4B, 4C and 4D show various stages of a production process of chip-type light-emitting devices as shown in FIG. 1; and FIG. 5 is a partially transparent diagonal view of a prior art chip-type light emitting device.

Throughout herein, like components are indicated by the same numerals.

DETAILED DESCRIPTION OF THE INVENTION

The invention is described next by way of an example with reference to the drawings in FIGS. 1, 2 and 3 in which like or equivalent components as described above with reference to FIG. 5 are indicated by the same numerals and may not be described repetitiously.

FIG. 1 is a front view of a chip-type semiconductor light-emitting device 10 embodying this invention characterized as having solder materials 9a and 9b partially filling the grooves 7 and 8, respectively, formed on the mutually oppositely facing edges of a substrate 2 to a height below the top surface of the substrate 2 and a transparent resin mold 6 which extends horizontally to positions of the edges of the substrate 2 and protrudes partially from above into the grooves 7 and 8 on the edges of the substrate 2. Because the lower parts of the grooves 7 and 8 are occupied with the solder materials 9a and 9b, the resin material for forming the mold 6 does not penetrate below the contact surfaces 6a and 6b between the solder materials 9a and 9b and the mold 6.

In other words, the inner surfaces of the side surface electrodes 3b and 4b are prevented from entirely covered by the transparent resin mold 6 and hence the electrically conductive routes therethrough are not shut off, while the resin material of the mold 6 is prevented from passing through the grooves 7 and 8 to reach the bottom side of the substrate 2.

Because the mold 6 extends horizontally to positions of the edges of the substrate 2 and partially penetrates the grooves 7 and 8, it serves as hooks for preventing it from disengaging from the substrate 2. Thus, even if the mold 6 is subjected to a vibrational or impulsive external force, the mold 6 is not separated from the surface of the substrate 2 and hence the sealed condition of the LED chip 1, as an example of electronic device, and the metallic wire 5 is not adversely affected.

Next, a method for producing devices 10 as described above will be explained with reference to FIGS. 4A, 4B, 4C and 4D. First, as shown in FIG. 4A, throughholes 7, 8, 8a, . . . are formed sequentially both in longitudinal and transverse directions through a base board 2a, from which the substrates 2 are to be obtained. Next, a pair of electrode patterns 3 and 4 including side surface electrodes on the inner surfaces of the grooves is formed on each of the areas destined to be the individual substrates 2 when the base board 2a is cut eventually. An LED chip 1 is attached by wire bonding onto a pad which is provided to a portion of one of the electrode patterns (3), and the electrode on the LED chip 1 is electrically connected to the other of the electrode patterns (4) also by wire bonding. One thus obtains a large number of LED chips 1 aligned longitudinally and transversely on the top surface of the base board 2a, although FIG. 4A shows only a longitudinal array.

Next, the throughholes 7, 8, 8a, . . . are filled with small pieces of a solder material 9 such as solder balls or solder powder to the height of the top surface of the base board 2a, as shown in FIG. 4B and these small pieces of solder material 9 are then heated, for example, by a laser beam and melted at a specified temperature. Thereafter, as the melted solder material 9 is cooled and solidified, it shrinks inside each of the throughholes 7, 8, 8a, . . . so as to rise therein only to an intermediate height below the top surface of the base board 2a, as shown at 9a, 9b, 9c, . . . and the top surface of the base board 2a is completely covered by a layer of a transparent resin mold 6, portions of this resin mold material entering the top portions of the throughholes 7, 8, 8a, . . . above the solder material 9a, 9b, 9c, . . . , as shown in FIG. 4C.

Lastly, the base board 2a is cut transversely along lines A—A, B—B, C—C, . . . , as shown in FIG. 4D and also longitudinally so as to obtain many individual chip-type light-emitting devices 10, each having a rectangularly shaped substrate 2.

The invention was described above by way of a chip-type light-emitting device but this is not intended to limit the scope of the invention. Many modifications and variations are possible within the scope of this invention. For example, this invention generally includes chip-type electronic devices of other kinds having a semiconductor element such as a diode or a transistor disposed on a substrate and sealed within a resin mold. With devices embodying this invention, the aforementioned problems with prior art technology such as the difficulty in mounting to a circuit board because of the small surface area of the resin mold and the ease with which the resin mold becomes separated from the substrate can be obviated. The invention is particularly useful when it relates to very small chip-type electronic devices with dimensions less than 1.6×0.8 mm and more particularly those with dimensions less than 1.0×0.5 mm.

What is claimed is:

1. A chip-type electronic device comprising:

a substrate having a top surface and mutually opposite edges having a vertically extending grooves formed thereon;

a solder material filling said grooves partially to a height which is below said top surface of said substrate;

electrode patterns formed on said mutually opposite edges;

a semiconductor element on said top surface of said substrate; and a resin mold sealing said semiconductor element therein, extending to positions of said edges and protruding partially into said grooves.

2. The chip-type electronic device of claim 1 wherein said substrate is rectangular and smaller than 1.6×0.8 mm.

3. The chip-type electronic device of claim 1 wherein said substrate is rectangular and smaller than 1.0×0.5 mm.

4. The chip-type electronic device of claim 1 wherein said semiconductor element is a light-emitting diode chip.

5. The chip-type electronic device of claim 1 wherein said substrate has a bottom surface opposite said top surface and wherein said electrode patterns extend over both said top surface and said bottom surface.

* * * * *